(12) United States Patent
Chew

(10) Patent No.: US 10,943,887 B2
(45) Date of Patent: Mar. 9, 2021

(54) STAGGERED DIE STACKING ACROSS HETEROGENEOUS MODULES

(71) Applicant: Intel Corporation, Santa Clara, CA (US)

(72) Inventor: Yen Hsiang Chew, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/853,201

(22) Filed: Apr. 20, 2020

(65) Prior Publication Data
US 2020/0251446 A1    Aug. 6, 2020

Related U.S. Application Data

(62) Division of application No. 16/021,351, filed on Jun. 28, 2018, now Pat. No. 10,651,148.

(30) Foreign Application Priority Data

Dec. 13, 2017  (MY) .......................... PI 2017704785

(51) Int. Cl.
| | | |
|---|---|---|
| *H01L 23/31* | (2006.01) | |
| *H01L 25/065* | (2006.01) | |
| *H01L 23/538* | (2006.01) | |
| *H01L 21/56* | (2006.01) | |
| *H01L 25/00* | (2006.01) | |
| *H01L 21/027* | (2006.01) | |
| *H01L 25/10* | (2006.01) | |
| *H01L 21/48* | (2006.01) | |

(52) U.S. Cl.
CPC ...... *H01L 25/0655* (2013.01); *H01L 21/0273* (2013.01); *H01L 21/486* (2013.01);
(Continued)

(58) Field of Classification Search
CPC .................................................. H01L 25/0655
(Continued)

(56) References Cited

U.S. PATENT DOCUMENTS

| | | | |
|---|---|---|---|
| 10,163,858 B1* | 12/2018 | Liu | H01L 23/5226 |
| 2007/0096306 A1* | 5/2007 | Yamagata | H01L 25/165 |
| | | | 257/734 |

(Continued)

FOREIGN PATENT DOCUMENTS

WO    WO-2019066937 A1 *  4/2019 ............. H01L 25/50

OTHER PUBLICATIONS

"U.S. Appl. No. 16/021,351, Final Office Action dated Oct. 4, 2019", 16 pgs.
(Continued)

*Primary Examiner* — Ajay Arora
(74) *Attorney, Agent, or Firm* — Schwegman Lundberg & Woessner, P.A.

(57) ABSTRACT

An electronic package can include a substrate, a first die and a second die. The first die can include a first thickness and the second die can include a second thickness. The first and second dies can be coupled to the substrate. A mold can be disposed on the substrate and cover the first die and the second die. The mold can include a planar upper surface. A first via, having a first length, can be extended between the first die and the planar upper surface. A second via, having a second length, can be extended between the second die and the planar upper surface. In some examples, a third die can be communicatively coupled to the first die using the first via and the second die using the second via.

16 Claims, 8 Drawing Sheets

(52) U.S. Cl.
CPC ............ *H01L 21/56* (2013.01); *H01L 21/565* (2013.01); *H01L 23/3128* (2013.01); *H01L 23/5381* (2013.01); *H01L 23/5384* (2013.01); *H01L 23/5386* (2013.01); *H01L 25/105* (2013.01); *H01L 25/50* (2013.01); *H01L 2225/1023* (2013.01); *H01L 2225/1058* (2013.01)

(58) Field of Classification Search
USPC .......................................... 257/668; 438/109
See application file for complete search history.

(56) References Cited

U.S. PATENT DOCUMENTS

| | | | |
|---|---|---|---|
| 2016/0148906 A1* | 5/2016 | Lee | H01L 25/0657 257/774 |
| 2018/0040548 A1* | 2/2018 | Kim | H01L 25/0657 |
| 2019/0181118 A1 | 6/2019 | Chew | |

OTHER PUBLICATIONS

"U.S. Appl. No. 16/021,351, Non Final Office Action dated Jun. 27, 2019", 12 pgs.
"U.S. Appl. No. 16/021,351, Notice of Allowance dated Jan. 10, 2020", 8 pgs.
"U.S. Appl. No. 16/021,351, Response filed May 29, 2019 to Restriction Requirement dated Apr. 4, 2019", 7 pgs.
"U.S. Appl. No. 16/021,351, Response filed Nov. 20, 2019 to Final Office Action dated Oct. 4, 2019", 9 pgs.
"U.S. Appl. No. 16/021,351, Response filed Sep. 24, 2019 to Non-Final Office Action dated Jun. 27, 2019", 11 pgs.
"U.S. Appl. No. 16/021,351, Restriction Requirement dated Apr. 4, 2019", 7 pgs.
U.S. Appl. No. 16/021,351, filed Jun. 28, 2018, Staggered Die Stacking Across Heterogeneous Modules.

* cited by examiner

STAGGERED DIE STACKING ACROSS HETEROGENEOUS MODULES

PRIORITY

This application is a divisional of U.S. patent application Ser. No. 16/021,351, filed Jun. 28, 2018, which claims the benefit of priority to Malaysian Application Serial Number PI 2017704785, filed Dec. 13, 2017, each of which are incorporated herein by reference in their entirety.

TECHNICAL FIELD

This document pertains generally, but not by way of limitation, to multi-die electronic packages.

BACKGROUND

Electronic packages can include one or more dies communicatively coupled together. In some instances, the dies can be stacked to increase the number of dies that occupy an area of a substrate of the electronic package. In other examples, an upper die can be stacked on two or more lower dies. Accordingly, the upper die can be communicatively coupled between two or more lower dies. Each die may have a similar or a different interconnect scheme. For instance, the number, size, or the pitch of the die contacts can vary between dies. This can be a result of the manufacturer, individual die design, or die type (e.g., memory, processor, wireless module, sensor, or the like). In some examples, various dies can include different thicknesses. Differences in thickness may be by design or by virtue of manufacturing tolerances. When placing an upper die between two or more lower dies with different thicknesses, accommodation for the height difference between dies can be provided. Some examples of such height accommodation can include using various sized solder bumps or interposers. For example, larger bumps can be used to accommodate the difference between a thinner lower die and a thicker lower die so the upper die can be placed in a level orientation across the thinner lower die and the thicker lower die.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
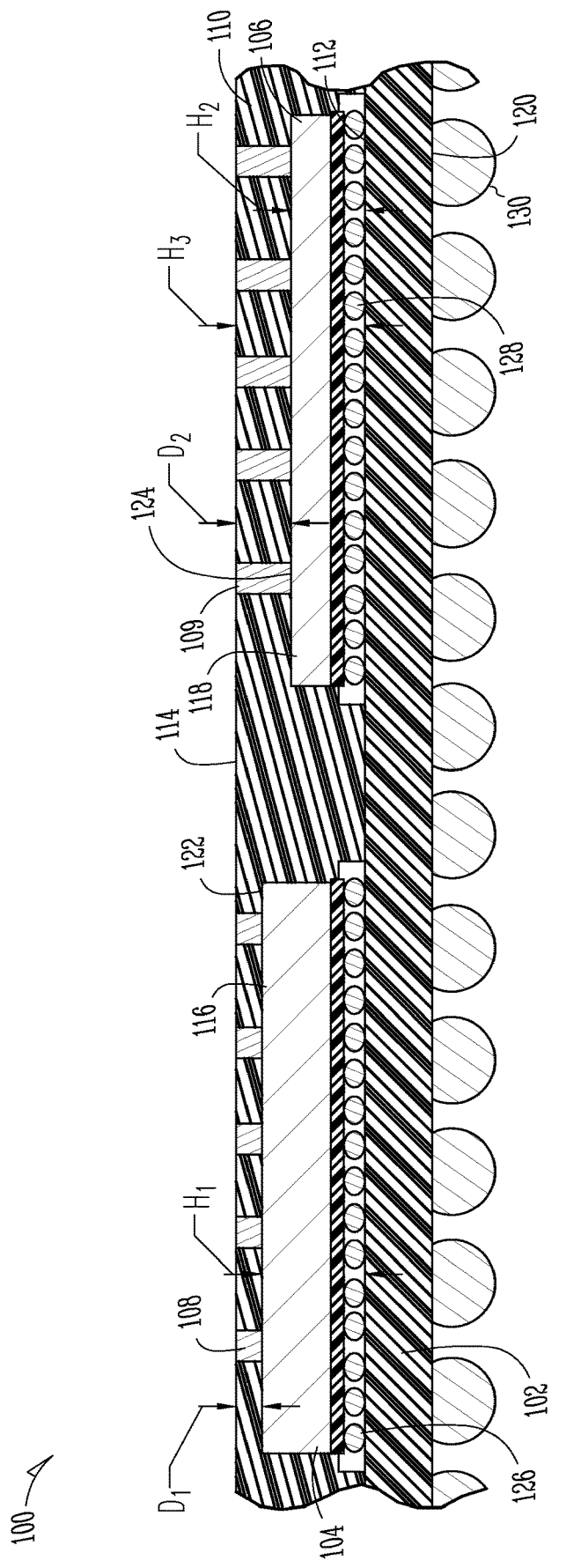
FIG. 1 illustrates an example of a cross section of an electronic package having a first die and a second die with a plurality of planarized vias, according to an embodiment.

The present application relates to devices and techniques for communicatively coupling stacked dies of an electronic package, such as communicatively coupling at least one upper die to a plurality of lower dies with one or more extended vias (e.g., through silicon vias). The following detailed description and examples are illustrative of the subject matter disclosed herein; however, the subject matter disclosed is not limited to the following description and examples provided. Portions and features of some embodiments may be included in, or substituted for, those of other embodiments. Embodiments set forth in the claims encompass all available equivalents of those claims.

The present inventors have recognized that among other technical challenges, one issue can include stacking one or more dies on top of two or more lower dies. For instance, two or more lower dies can be attached to a substrate and an upper die can be attached on the two or more lower dies. In some instances, a height of a first lower die can be different than a height of a second lower die. As discussed herein, the height of the die can be measured between an upper surface of the respective die and the upper surface of the substrate. Differences in height can result from variations in thickness between the lower dies or different interconnects coupling the dies to the substrate. For example, the number, size, or the pitch of interconnects (e.g., solder bumps, solder balls, or the like) can vary between dies. Differences in connection interfaces can also present the challenge of communicatively coupling the upper die to the respective lower dies having inconsistent interconnect types, sizes, or pitch.

In further examples, die thickness variation can be a result of the manufacturer, individual die design, or die type (e.g., memory, processor, wireless module, sensor, or the like), among other things. In some examples, various dies can include different thicknesses. For example, differences in thickness can be the result of design or by virtue of manufacturing tolerances.

Providing an accommodation for the height variation between lower dies for the attachment of the upper die can present technical challenges. For instance, using different interconnects can increase the number of process steps, the number of components in the electronic package, and result in thermal expansion differences across the upper die. Using an interposer to accommodate the height difference between the upper die and one of the lower dies (the lower die having the lesser height) can present similar issues for inventory, manufacturing process, and thermal stress reduction.

The present subject matter can provide a solution to stacking a die (e.g., an upper die) across one or more lower dies in an electronic package, such as attaching an upper die to a plurality of lower dies where the lower dies have variation in height from a substrate or where the lower dies include different connection interfaces. Stacking an upper die on a plurality of lower dies can increase the level of integration and communication among dies as well as decrease the overall length and width of the electronic package. In one example, the electronic package can include a substrate having a first die and a second die coupled to the substrate. For instance, the first and second dies can be referred to as lower dies. The first die can include a first thickness and the second die can include a second thickness. In some examples, the first thickness can be different than the second thickness. A mold can be disposed on the substrate and can cover the first die and the second die. The mold can include a planar upper surface. By providing communicative coupling directly between one or more lower dies and the upper die, an electrical path length of a circuit between the dies can be decreased. For instance, the electrical connection between the dies can be more direct and can avoid the substrate. Reducing the electrical path length can increase transmission speed and decrease signal power loss.

A via, such as a first via or a second via, can be extended between the respective first or second dies and the upper surface. For instance, the first via can be extended between the first die and the planar upper surface. The second via can be extended between the second die and the planar upper surface. The first via can include a first length and the second via can include a second length. In some instances, the first length can be different than the second length, for instance, where the first die has a different height (e.g., from the substrate) than the second die. Locating the via, such as the first via and the second via, on the planar upper surface reduces variation in distance between the substrate and the vias. For instance, the mold and vias can be planarized in one step to form the planar upper surface, thereby reducing height and tolerance variation. Accordingly, the effect of differences in thickness among the lower dies, such as the first die and the second die, are mitigated from affecting the location of the vias along the planar upper surface. In some examples, variation in height between the vias, such as the first via and the second via, can be reduced by directly coupling the upper die to the first and second vias located on the planar upper surface without any intervening components, such as an interposer or a different interconnect. Accordingly, dies (e.g., first, second, or third dies) from various manufacturers can be communicatively coupled within the electronic package regardless of variations between interconnect size, tolerances, dimensions, or the like.

In a further example, the via, such as the first or second via, can extend at least partially through the die (e.g., the respective first or second dies). For instance, the via can be through-silicon via (TSV). The portion of the vias located in the respective die can be referred to as a die portion and the portion of the respective via located within the mold can be referred to as a mold portion. In some examples, the mold portion of the via can include a different width than the respective die portion of the via.

The upper die (e.g., third die) can be attached to the upper surface of the mold and communicatively coupled to the first die by the first via and the second die by the second via. Accordingly, the third die can be communicatively coupled to the first die and the second die. The third die can be attached to the first via and the second via with a plurality of interconnects (e.g., solder balls, solder bumps, conductive adhesive, surface activated bonding, or the like). In an example, the interconnects attaching the third die to the first via and the second via can be the same. For instance, the interconnects can be of the same type, geometry, size, or pitch. Using the same interconnect to couple the upper die to the plurality of lower dies reduces the number of components, thereby simplifying the assembly process, standardizing the interconnect, and reducing cost. Using the same interconnect can reduce thermal expansion variation between the lower dies and the upper die. For instance, the interconnects can have the same coefficient of thermal expansion. Because the vias are located on the planar upper surface at the same distance from the substrate, other sources of thermal expansion difference can be removed, such as different interconnects or interposers.

In some examples, conductive routing can be located on the planar upper surface. For instance, the planar upper surface can be patterned to provide trace routing. In an example, the third die can be communicatively coupled to the conductive routing. For instance, the third die can be communicatively coupled to one or more of the dies through at least one via and the conductive routing.

In a further example, the lower dies (e.g., the first and second dies) can be communicatively coupled through an interconnect bridge, such as an embedded multi-die interconnect bridge (EMIB). For instance, the interconnect bridge can be located within the substrate or the third die can be an interconnect bridge. The interconnect bridge can be constructive of a semiconductor, such as silicon or gallium arsenide. Photolithographic techniques can be used on the semiconductor to provide fine pitch interconnections at a low cost. Accordingly, the first and second dies can be communicatively coupled using fine pitch conductors available with the interconnect bridge. Locating the interconnect bridge on top of the first and second dies, such as using the third die as an interconnect bridge, can reduce production costs and provide additional locations for routing the interconnect bridge between the lower dies, such as the first die and the second die.

Figure 8:
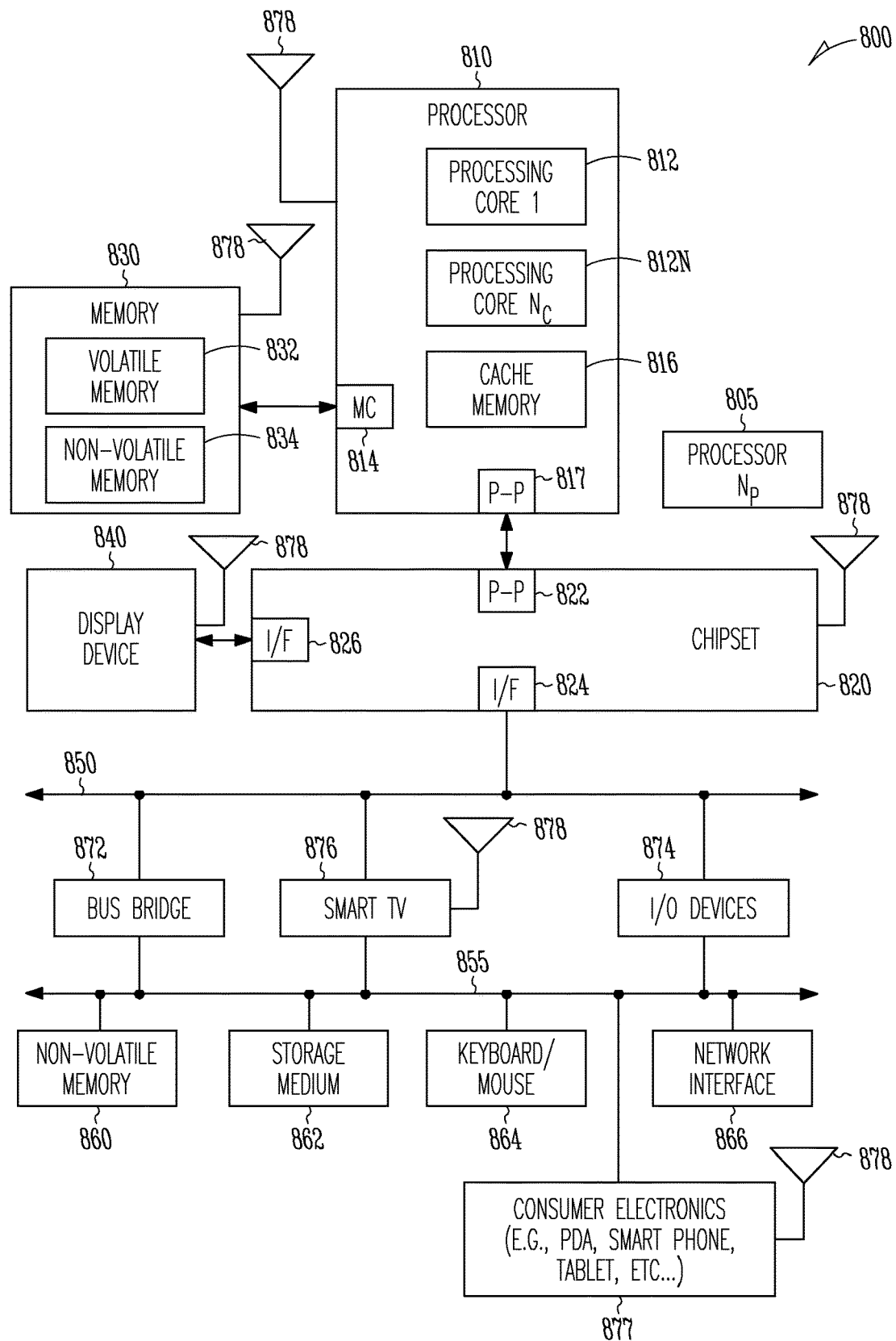
FIG. 8 illustrates a system level diagram in accordance with some embodiments of the invention.

FIG. 1 illustrates an example of a cross section of an electronic package 100 having a plurality of planarized vias, such as a first via 108 and a second via 109. In some examples, the electronic package 100 can be included in an electronic device, such as the electronic device 800, as shown in FIG. 8 and described herein. The electronic package 100 can include a plurality of lower dies, such as a first die 104 and a second die 106. The lower dies (e.g., first die 104 and second die 106) can be electrically coupled to a substrate 102. For instance, the first die 104 and second die 106 can be electrically coupled to a connection interface of the substrate 102. The example of FIG. 1 depicts two lower dies (e.g., the first die 104 and the second die 106); however, it is to be understood that some examples of the electronic package 100 can include a greater number of lower dies.

The vias (also referred to herein as a planarized vias), such as the first via 108 and the second via 109, can extend from an upper surface of the respective dies. For instance, a first via 108 can extend from an upper surface 116 of the first die 104 and a second via 109 can extend from an upper surface 118 of the second die 106. The first via 108 and the second via 109 will be described herein, however, it is to be understood that a plurality of vias can be located along the respective upper surfaces of the lower dies, as shown in the example of FIG. 1. Each of the vias of the respective first or second dies can include the same or different properties or geometries.

A mold 110 can be disposed on the substrate 102. In an example, the first die 104, the second die 106, and the plurality of vias (e.g., first via 108 and second via 109) can be covered by the mold 110. The mold 110 can include an upper surface, such as a planar upper surface 114. In various examples, the vias, such as the first via 108 and the second via 109, can include a length extended between the upper surface of the respective dies and the planar upper surface 114 of the mold 110. For instance, the first via 108 can have a length D1 and the second via 109 can have a length D2. The plurality of vias (e.g., first via 108 and second via 109) can be located along the planar upper surface 114. Variation in the height H3 of the planar upper surface 114 (e.g., the thickness of the mold 110) can be reduced to provide a level attachment surface for an upper die (e.g., a third die 232 shown in FIG. 2 and described further herein). Level placement of the upper die can improve the alignment of the various interconnects and connection interfaces of the upper die with the corresponding vias along the planar upper surface 114 (e.g., along the length and width of the electronic package). In other examples, a non-planar upper surface is also contemplated. The upper die can be electrically coupled to the lower dies along the non-planar upper surface. Interconnects having different heights or an interposer can be used to couple the upper die to one or more of the lower dies.

Where the first die 104 includes a height H1 that is different than a height H2 of the second die 106 with respect to the substrate 102, the differences in the length D1 of the first via 108 and the length D2 of the second Via 109 can locate the second end (e.g., upper end) of the vias 108, 109 along the planar upper surface 114 at the same height H3 from the substrate 102. Thus, alignment of the respective connection interfaces between the upper die and the plurality of lower dies can be improved as a result of the reduction in height variation among the vias, such as the reduction in variation of height H3 along the planar upper surface 114.

The substrate 102 can include one or more routing layers disposed on at least one dielectric layer. In some examples, the substrate 102 can be a core or a coreless substrate for supporting the dies (e.g., the first die 104 or the second die 106) of the electronic package 100. In various examples, the substrate 102 can include multiple routing layers. Dielectric layers can be disposed along one or more sides of each routing layer. one or more connection interfaces can be included along the upper surface 112 or the lower surface 120 of the substrate. An interconnect, such as interconnect 130, can be communicatively coupled between a connection interface along the lower surface 120 and the electronic device. The interconnect can include, but is not limited to, a solder ball, solder bump, pin, or other electrical contact. Accordingly, the substrate 102 can support the plurality of dies and provide electrical signal routing between the electronic device and the plurality of dies.

A connection interface can include, but is not limited to, a solder pad, electrical contact, ball grid array contacts, or the like. In various examples, the connection interface can be located on an upper or lower surface of a die, substrate, or mold, such as the connection interface located along the lower surface 120, upper surface 112, first die 104, second die 106, other die (e.g., third die), or planar upper surface 114. The connection interface can facilitate mechanical and electrical coupling of various components of the electronic package, such as the substrate to one or more dies, one die to another die, or a via to a die.

The dies, such as the first die 104 and the second die 106, can include, but are not limited to, memory modules, processors, digital signal processors (DSPs), field programmable gate arrays (FPGAs), or other type of die. In some examples, the dies can be fabricated of silicon, Gallium Arsenide, or other semiconductor. In the example of FIG. 1, the various dies can include different thicknesses. For instance, the first die can include a first thickness T1 and the second die can include a second thickness T2. At least two dies (e.g., the lower dies, such as the first die 104 and the second die 106) can be communicatively coupled to the substrate 102. For instance, the lower dies can be directly coupled along the upper surface 112 of the substrate 102 with a plurality of interconnects. In an example, the first die 104 can be electrically coupled to the substrate 102 with a first interconnect 126 (e.g., ball grid array) and the second die 106 can be electrically coupled to the substrate 102 with a second interconnect 128 (e.g., ball grid array). The dies can include an upper surface, such as the upper surface 116 of the first die 104 or the upper surface 118 of the second die 106. In some examples, the upper surface of one or more dies can include a connection interface, as described further herein. For instance, the upper surface 116, 118 of the dies can be patterned to form one or more connection interfaces. In an example, the connection interfaces can be electrically coupled to an active surface of the dies 104, 106 (e.g., using vias, wire bonding, or through-silicon vias). One or more vias (e.g., 108, 109) can be electrically and mechanically coupled (e.g., formed) on the connection interfaces of the upper surfaces 116, 118. Accordingly, the connection interface can be used to provide a communicative coupling between two or more dies.

Figure 2:
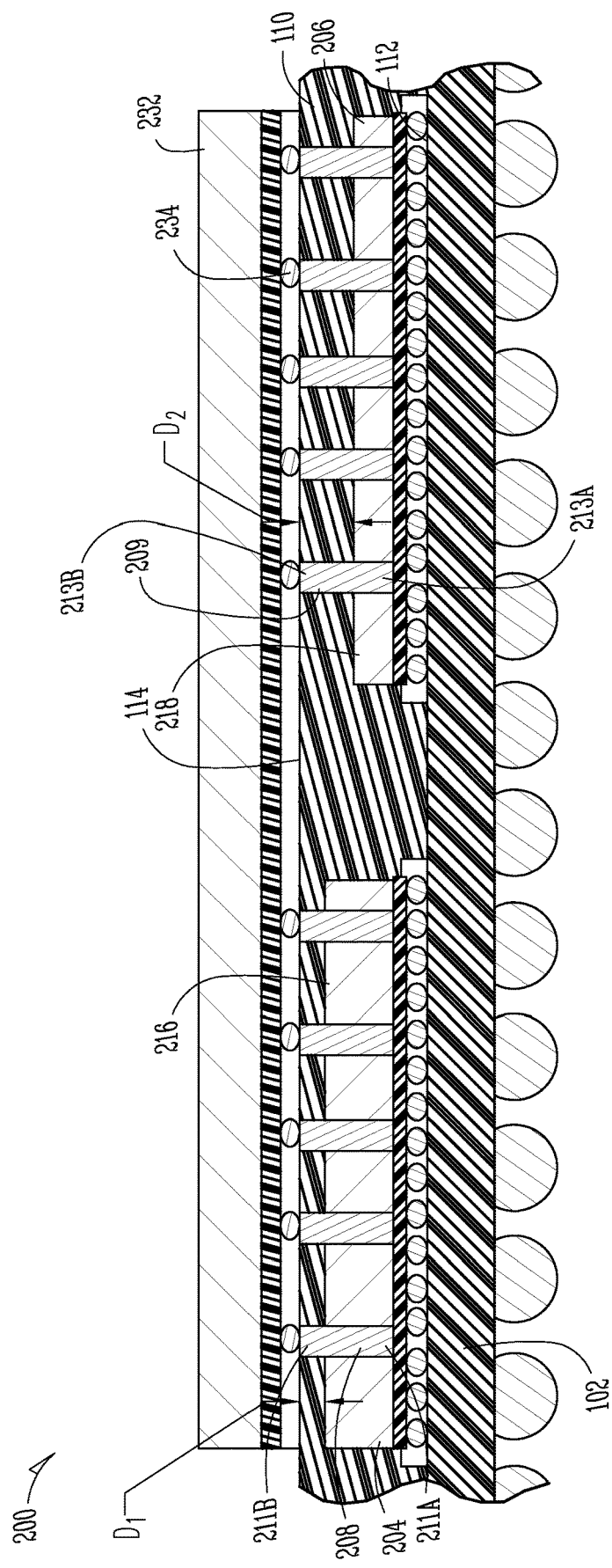
FIG. 2 is an example of a cross section of an electronic package including a third die communicatively coupled to a first die with a planarized via and a second die with another planarized via, according to an embodiment.

The vias (also referred to herein as planarized vias), such as the first via 108 and the second via 109, can be conductive pillars. The vias can be disposed on the respective upper surfaces 116, 118 of the respective lower dies 104, 106. For instance, the first via 108 can be extended between the upper surface 116 and the planar upper surface 114 and the second via 109 can be extended between the upper surface 118 and the planar upper surface 114. In other words, a first end of the vias 108, 109 can be located on the respective dies 104 and 106 and a second end of the vias 108, 109 can be located along the planar upper surface 114 of the mold 110. Accordingly, the second end of the respective vias 108, 109 can be planarized (e.g., located along a level plane). The via can provide electrical communication between the lower dies (e.g., the first die 104 and the second die 106) and an upper die. The upper die (e.g., upper die 232 as shown in FIG. 2 and described herein) can be attached to the first via 108 and the second via 109 along the planar upper surface 114 of the mold 110. For instance, the second end of the vias 108, 109 can include a connection interface.

In the example of FIG. 1, the first die 104 and the second die 106 can include different thicknesses. For instance, the various dies can be of different types, designs, or manufacturers. In various examples, the dies can be a processor, a memory module, a single-die, a multi-die, flip-chip, lead frame, BGA, or other type of die. Due to different thicknesses, the upper surface 116 of the first die 104 can be located at the height H1 from the substrate 102, and the upper surface 118 of the second die 106 can be located at the second height H2 from the substrate 102. Accordingly, the first via 108 can include a first length D1 and the second via 109 can include a second length D2 different than the first length D1.

In some examples, the vias (e.g., vias 108, 109) can be constructed of copper, solder, or other electrically conductive material. The vias can be formed using electroplating, electroless plating, casting, conductive paste or epoxy, or any combination thereof. Other process for forming the via can be used as well. In an example, a photoresist layer can be disposed on the upper surface of the die. The photoresist can be etched to generate apertures within the photoresist. The apertures can then be filled with the conductive material. For example, the apertures can be electrolessly plated and filled to construct the vias. The photoresist can be removed after the via formation and before the mold 110 is applied to the electronic package 100. In other examples, the vias can be formed within apertures of the mold 110 (e.g., following the application of the mold 110). For instance, holes can be drilled in the mold 110 (e.g., laser drilled) and the vias can be formed within the holes of the mold 110. In an example, the vias can be deposited in the mold using electroless plating, electro-plating, or other process for forming a conductive pillar. In other words, the vias can be through-mold vias. In some examples, the vias can be formed on the dies at the wafer level, for example, before die singulation.

The mold 110 can be disposed on the substrate 102, the lower dies (e.g., first die 104 and second die 106), and the vias (e.g., vias 108 and 109). The mold 110 can be constructed of various materials including, but not limited to, liquid crystal polymer, nylon, epoxy, silica, or other mold compound materials. An upper portion of the mold 110 can be planarized to provide the planar upper surface 114. For instance, the upper portion of the mold 110 can be removed by a cutting or grinding operation to provide the planar upper surface 114. As a result, the vias 108, 109, such as the second end of the first via 108 and the second end of the second via 109, can be exposed and located along the planar upper surface 114. For instance, the vias can be cut or ground during planarization so the second end of the vias are co-planar with the planar upper surface 114. Variations in thickness among the lower dies 104, 106 can be mitigated by locating the vias 108, 109 along the planar upper surface 114. For instance, various thicknesses of lower dies can be used and the one or more upper dies can be attached to the plurality of lower dies 104, 106 in a level orientation (e.g., parallel to the respective lower dies or substrate 102). In other words, the upper die can be attached to the vias 108, 109 in a level orientation with respect to the substrate 102 or the lower dies 104, 106.

Figure 4:
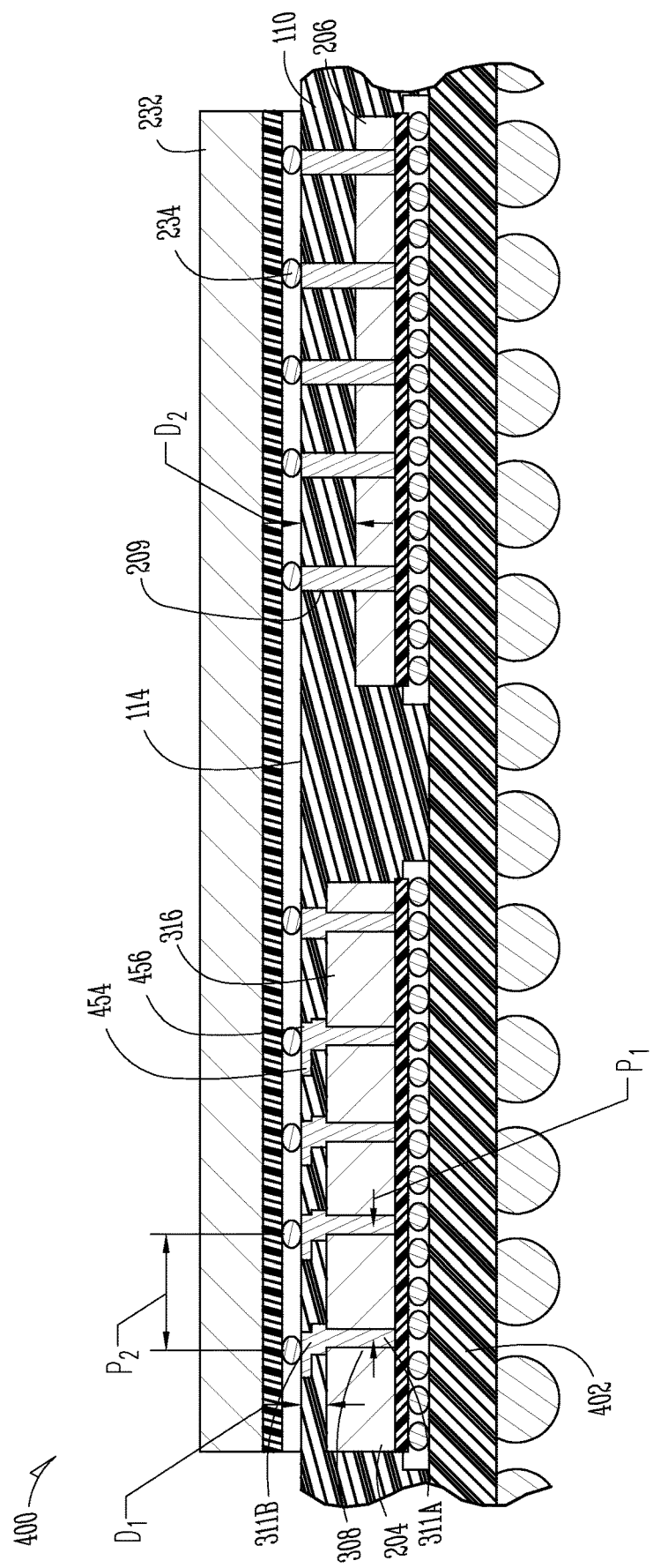
FIG. 4 depicts an example of a cross section of an electronic package having a mold with a planarized upper surface and a conductive routing along the planarized upper surface electrically coupled to a planarized via, according to an embodiment.

In some examples, the mold 110 can increase the robustness of the electronic package 100 and electrically isolate the various dies and vias from one another. In further examples, the planar upper surface 114 can include a conductive routing, as shown in FIG. 4 and described herein. For instance, a conductive layer can be disposed on the planar upper surface 114 and the conductive layer can be patterned to provide various connection interfaces or circuit routings along the planar upper surface 114. In other examples, the mold 110 can be a thermally conductive material (but non-electrically conductive) and can be used for transferring heat from the dies.

As previously mentioned, the electronic package 100 can include various interconnects (e.g., interconnects 126, 128, 130), such as solder balls, solder bumps, conductive adhesive, or the like. The interconnects can be used to electrically couple the substrate 102 to the electronic device, the substrate 102 to the lower dies (e.g., the first die 104 and the second die 106), the vias 108, 109 to one or more dies (e.g., the upper die), or provide other electrical connections. For instance, the interconnects can be coupled between the various vias, substrates, and connection interfaces (e.g., the connection interfaces located on the upper substrate surface 112, upper surface 116, upper surface 118, or planar upper surface 114). In some examples, the same interconnects can be used for attaching the first die 104 and the second die 106 to the substrate 102. For instance, the interconnects can be of the same type, geometry, size, or pitch. Using the same interconnect to couple the plurality of lower dies to the substrate 102 reduces the number of components, thereby simplifying the assembly process, standardizing the interconnect scheme, and reducing cost. In a further example, using the same interconnect can reduce thermal expansion variation between the lower dies and the upper die. For instance, because the interconnects can have the same coefficient of thermal expansion, other sources of thermal expansion difference (e.g., related to geometry or material) can be removed.

FIG. 2 is an example of a cross section of an electronic package 200 including an upper die communicatively coupled to a plurality of lower dies. For instance, the upper die can include a third die 232. The third die 232 and the lower dies, such as lower die 204 and 206, can include the examples of the die, such as the first die 104 and the second die 106 previously described herein. The third die 232 can be communicatively coupled to the first die 204 using a first via 208 and can be communicatively coupled to the second die 206 using a second via 209. In the example of FIG. 2, the electronic package 200 includes one upper die (e.g., the third die 232), however, it is to be understood that the electronic package 200 can include a greater number of upper dies communicatively coupled among at least two lower dies. For instance, the upper die can be attached on (e.g., stacked) on top of the lower dies, such as spanning between a plurality of lower dies, such as the first die 204 and the second die 206.

Attaching an upper die on a plurality of lower dies can increase the level of integration and communication among the dies as well as decrease the overall length and width of the electronic package 200. By providing communicative coupling directly between one or more lower dies (e.g., the first die 204 and the second die 206) and the upper die (e.g., the third die 232), an electrical path length of a circuit between the upper die and the lower dies can be decreased. For instance, the electrical connection between the upper die and the lower dies can be more direct and can avoid the substrate 102. In some examples, shorting the electrical path length can increase transmission speed and decrease signal power loss. In a further example, the processing speed or memory of the electronic package 200 can be increased by increasing the number of dies, for instance by attaching the third die 232 to the electronic package 200.

In the example depicted in FIG. 2, the first via 208 and the second via 209 can extend into the first die 204 and the second die 206. For instance, the via (e.g., the first via 208 or the second via 209) can include a first portion extending into the respective die (e.g., a die portion) and a second portion extending through the mold 110 (e.g., a mold portion). For example, the first via 208 can include a die portion 211A and a mold portion 211B. The second via 209 can include a die portion 213A and a mold portion 213B. Thus, in some examples, the first die 204 or the second die 206 can include one or more through silicon vias (e.g., vias 208, 209; or die portions 211A, 213A). Accordingly, different layers of the dies can be communicatively coupled to another die, such as directly coupled, using the first via 208 or the second via 209.

The third die 232 can be electrically coupled to the plurality of vias, such as the first via 208 and the second via 209, with a plurality in interconnects, such as interconnects 234. In some examples, the same interconnects can attach the third die 232 to the first via 208 and the second via 209, as shown in the example of FIG. 2. Using the same interconnects (e.g., interconnect 234) to couple the upper die to the plurality of lower dies reduces the number of different components, thereby simplifying the assembly process, standardizing the interconnect scheme, and reducing cost. As described herein, the same interconnect refers to interconnects having the same design and material (e.g., the same part number). In an example, using the same interconnect can reduce thermal expansion variation between the lower dies and the upper die. For instance, the interconnects can have similar coefficients of thermal expansion. Because the vias are located on the planar upper surface 114 (e.g., at the same height H3 from the substrate 102), other sources of thermal expansion difference can be removed, such as different interconnects or interposers.

In various examples, the third die 232 can include, but is not limited to, a memory module, a radio frequency module, or a sensor module. The first die 204 and the second die 206 can include, but are not limited to, a processor, FPGA, DSP, a silicon photonics die, or any combination thereof. For instance, the electronic package 200 can include: a memory module on top of processor and FPGA die, an RF die on top of a processor die and a DSP die, a sensor module on top of a processor die and a silicon photonics die. In various examples, the first die 204, second die 206, and third die 232 can be from the same manufacturer or any combination of different manufacturers.

As previously described, the mold 110 and vias (e.g., the first via 208 and the second via 209) can be planarized in one step to form the planar upper surface 114, thereby reducing height and tolerance variation with respect to the substrate 102. Accordingly, the effect of differences in thickness among the lower dies, such as the first die 204 and the second die 206, are mitigated from affecting the height of the second end (e.g., upper end) of the vias along the planar upper surface 114. In some examples, variation in height between the vias, such as the first via 208 and the second via 209, can be reduced by directly coupling the upper die (e.g., third die 232) to the first via 208 and the second via 209 located on the planar upper surface 114 without any intervening components, such as an interposer or a different interconnect. Accordingly, dies (e.g., first die 204, second die 206, or third die 232) from various manufacturers can be communicatively coupled within the electronic package 200 regardless of variations between interconnect size, tolerances, dimensions, or the like. Unlevel attachment of the upper die can contribute to poor interconnect alignment, solder joint defects, and thermal expansion mismatch, among other things. Locating the vias along the planar upper surface 114, such as the planarized vias (e.g., first via 208 and second via 209) of the present disclosure, can mitigate unlevel attachment of the upper die and differences in thermal expansion between the upper die and the substrate 102.

Figure 3:
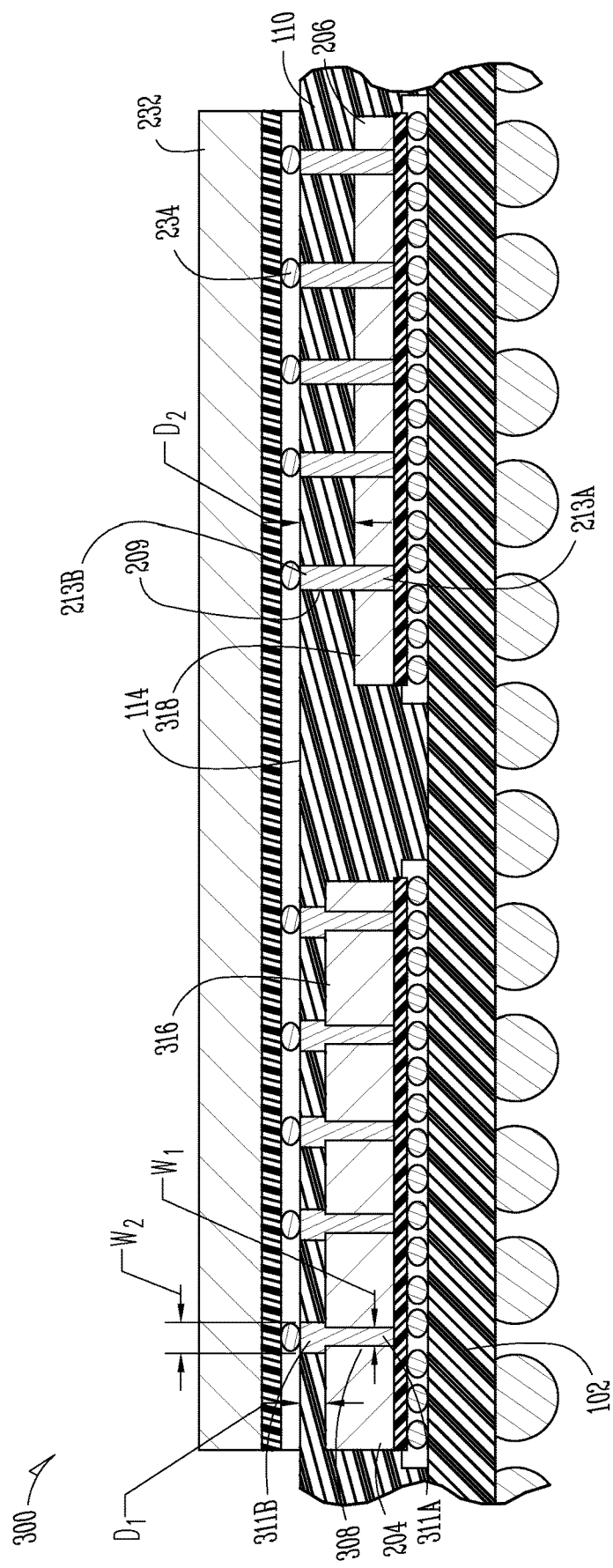
FIG. 3 illustrates an example of a cross section of an electronic package with a planarized via having a first width along a die portion and a second width along a mold portion, according to an embodiment.

FIG. 3 illustrates an example of a cross section of an electronic package 300 with a planarized via 308. The planarized via 308 can include the examples of the vias 108 and 208 as previously described herein. In the example of FIG. 3, the first via 308 can include a first width W1 along a die portion 311A and a second width W2 along a mold portion 311B. The width W1 of the die portion 311 can be different than the width W2 of the mold portion 311B. As discussed herein, the width W1, W2 of the vias, such as vias 308, 209 can be measured along an axis transverse to the length of the vias (e.g., length D1 or D2). In the example of FIG. 3, the width W1 of the die portion 311A can include a smaller width W2 (e.g., diameter) than the mold portion 311B. In some examples, the width W1 of the die portions can be the same as the width W2 of the mold portions. Dies from different manufacturers (e.g., the first die 204 and the second die 206) may have different via widths along the die portion. The vias of the present disclosure, such as via 308, can provide a consistent via width along the planar upper surface 114. Accordingly, where the second end of the vias 308, 209 are used as a connection interface, the same interconnect (e.g., interconnect 234) can be used to couple the upper die (e.g., third die 232) to the plurality of lower dies (e.g., the first die 204 and the second die 206).

FIG. 4 depicts an example of a cross section of an electronic package 400 including a conductive routing 454 along the planarized upper surface 114. The conductive routing 454 can be electrically coupled to a planarized via, such as the mold portion 311B of the via 308. For instance, the conductive routing 454 can be electrically coupled to a mold portion 311B of the first via 308. The conductive routing 454 can include a conductive layer disposed on the planar upper surface 114. To form the conductive routing 454, the conductive layer can be patterned to provide various connection interfaces or circuit routings. Where the plurality of vias (e.g., first vias 308 and second vias 209) have different pitches P1 (e.g., distance between the longitudinal axis of neighboring vias) or sizes (e.g., via widths), the conductive routing 454 can provide connection interfaces along the planar upper surface having a similar size and pitch P2, such as a size or pitch P2 that is compatible with the interconnects of the upper die (e.g., interconnects 234). For instance, the first via 308 can include a first pitch P1. The interconnects 234 coupling the third die 232 to the first via 308 can include a second pitch P2. The connection interface 456 located on the planar upper surface 114 can include the same pitch P2 as the connection interface of the third die 232. Accordingly, the conductive routing 454 can be used to communicatively couple connection interfaces 456 along the planar upper surface 114 to one or more vias (e.g., first via 308) having a different width or pitch P1 than the interconnects 234. As a result, the same interconnect 234 can be used to couple the third die 232 to the plurality of lower dies where the first die 204 includes vias (e.g., via 308) having a different width or pitch than the second via 209 coupled to the second die 206.

Figure 5:
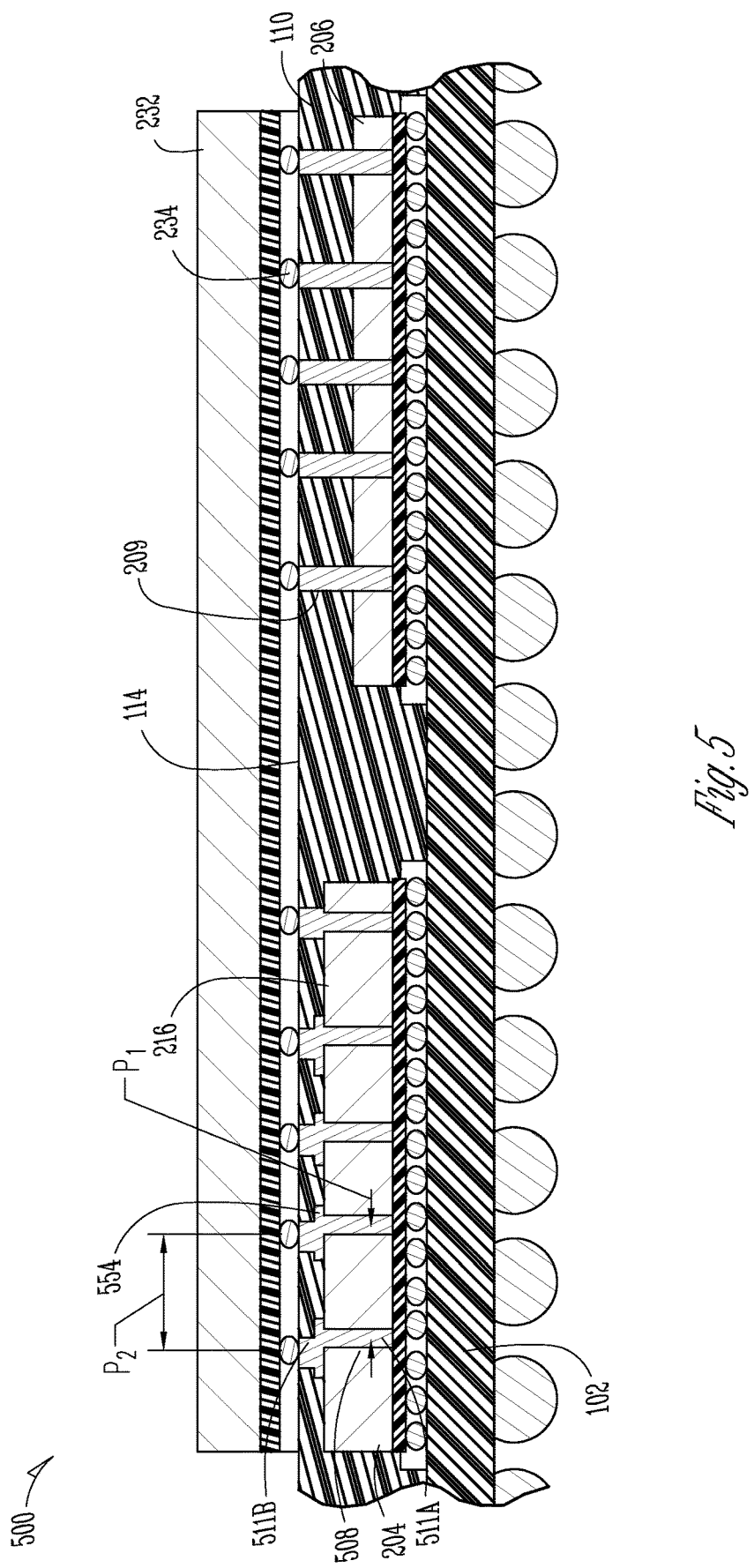
FIG. 5 depicts an example of a cross section of an electronic package 500 including a conductive routing on an upper surface of a die and a planarized via disposed between the conductive routing and the planar upper surface of a mold, according to an embodiment.

FIG. 5 depicts an example of a cross section of an electronic package 500 including a conductive routing 554 on an upper surface 216 of a die. For instance, the electronic package can include the first die 204 and the second die 206. The conductive routing can be located along the first die 204. A planarized via, such as a via 508 can be disposed between the conductive routing 554 and the planar upper surface 114. In the example of FIG. 5, the conductive routing 554 can communicatively couple a die portion of one or more vias with a mold portion of one or more vias. For instance, the conductive routing 554 can communicatively couple the die portion 511A of the via 508 to a mold portion 511B of the via 508. Accordingly, the pitch P1 of the die portions, such as 511A, can be different than the pitch of the mold portions, such as mold portion 511B. Similar to the example of FIG. 4, the conductive routing 554 can be used to communicatively couple mold portions of the vias (e.g., mold portion 511B) along the planar upper surface 114 to one or more die portions (e.g., die portion 511A) having a different width or pitch P1 than the interconnects 234. As a result, the same interconnect 234 can be used to couple the third die 232 to the plurality of lower dies where the first die 204 includes vias (e.g., via 508) having a different width or pitch P1 than the second via 209 coupled to the second die 206 or than the interconnects 234.

Figure 6:
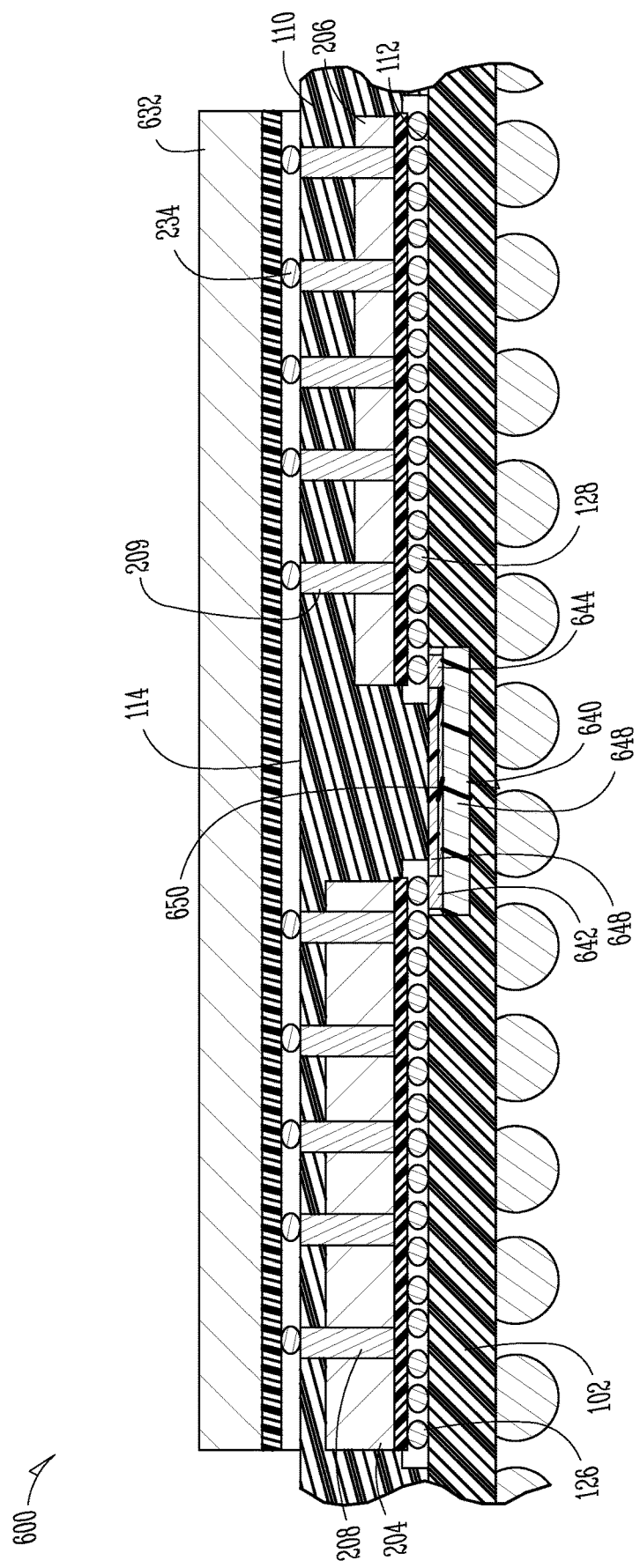
FIG. 6 illustrates an example of a cross section of an electronic package having a first die and a second die with a plurality of planarized vias, the first and second dies communicatively coupled with an interconnect bridge, according to an embodiment.

FIG. 6 illustrates an example of a cross section of an electronic package 600 including the first die 204 communicatively coupled to the second die 206 with an interconnect bridge, such as an embedded multi-die interconnect bridge (EMIB) 640. The electronic package 600 can include the examples of the electronic packages, 100, 200, 300, 400, and 500 as previously described herein. The interconnect bridge 640 can include a semi-conductive substrate, such as a silicon substrate, having conductive routing to communicate electrical signals between two or more dies. In an example, the conductive routing can include copper traces. The conductive routing can include one or more circuits or electrical communication pathways. For example, photo-lithographic techniques can be used on the semiconductor to provide fine pitch interconnections at a low cost. As a result of the semiconductor fabrication processes, the pitch and size (e.g., width and height) of the conductive routing within the interconnect bridge 640 can be reduced as compared to printed circuit boards. In the example of FIG. 6, the interconnect bridge 640 can include a semi-conductive substrate 648. At least one conductive routing 650 can be located on or within the substrate 648. The conductive routing 650 can extend between a first contact 642 and a second contact 644. In the example illustrated in FIG. 6, the interconnect bridge 640 can be located within the substrate 102. For instance, the interconnect bridge can be flush with the upper surface 112 of the substrate 102. Accordingly, the first contact 642 can be electrically coupled with a first interconnect of the first die 204, such as the first interconnect 126, and the second contact 644 can be electrically coupled to the second die with the second interconnect 128.

In an example, the third die, such as the third die 232 can be the interconnect bridge 640. The first contact 642 can be electrically coupled with the first via 208 and the second contact 644 can be electrically coupled with the second via 209. Accordingly, the interconnect bridge 640 can be attached to the planar upper surface 114 and communicatively coupled between the first die 204 and the second die 206. Locating the interconnect bridge 640 on the planar upper surface 114 (e.g., on top of the first die 204 and second die 206), can provide additional locations for routing the interconnect bridge 640 between the lower dies, such as the first die 204 and the second die 206.

Figure 7:
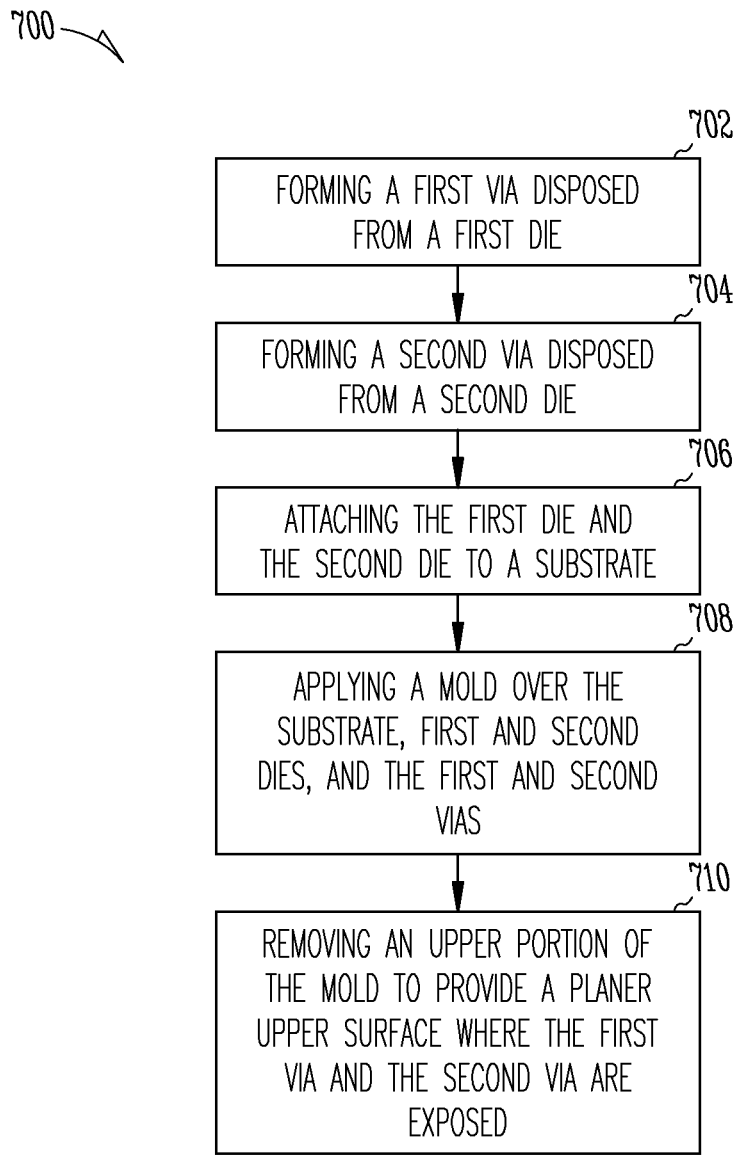
FIG. 7 is block diagram of an exemplary technique for making an electronic package with a plurality of planarized vias, according to an embodiment.

FIG. 7 is an example of a method 700 for making an electronic package with a plurality of planarized vias, such as the electronic packages 100-600 previously described in the examples herein and shown for instance in FIGS. 1-6. In describing the method 700, reference is made to one or more components, features, functions, and processes previously described herein. Where convenient, reference is made to the components, features, processes and the like with reference numerals. Reference numerals provided are exemplary and are nonexclusive. For instance, features, components, functions, processes, and the like described in the method 700 include, but are not limited to, the corresponding numbered elements provided herein. Other corresponding features described herein (both numbered and unnumbered) as well as their equivalents are also considered.

At 702, a first via can be formed on and disposed from a first die. In various examples, the first via can include the examples of the first via 108, 208, 308, and 508 as previously described herein.

At 704, a second via can be formed on and disposed from a second die. In various examples, the second via can include the examples of the second via 109 and 209 as previously described herein. In a further example, a mold portion of the first and second vias can be formed on an upper surface of the respective first and second dies. A die portion of the first and second vias can be located or formed within the respective first and second dies. The mold portion of at least one of the first or second vias can include a different width than the die portion of the respective first or second via. In some instances, a thickness of the first die can be different than a thickness of the second die. In a further example, the first via or the second via can be formed on the respective first or second dies at the wafer level. For instance, the plurality of vias, such as the first or second vias, can be formed prior to die singulation.

In some examples, forming the first via and the second via includes applying a photo resist layer to the lower dies, such as the respective first and second dies. At least one aperture, such as a first aperture, can be formed in the photo resist layer of the first die. At least one aperture, such as a second aperture can be formed in the photo resist layer of the second die. Next, a conductive material can be disposed in the plurality of apertures, such as the first aperture and the second aperture.

At 706, the first die and the second die can be attached to a substrate. For instance, the first die and the second die can be communicatively and mechanically coupled to the substrate. In some examples the first die or the second die can be soldered to the substrate or coupled with die attached film (e.g., conductive die attach film). In further examples, the first die or the second die can be coupled to the substrate with solder balls, solder bumps, a pin grid array, wire-bonded, or the like. In an example, where the photo resist is applied, the first die and the second die can be attached with the photo resist layer intact. The photo resist layer can protect the vias during attachment of the first and second dies.

At 708, a mold can be applied over the substrate, first die, the second die, the first via, and the second via. For instance, the mold can be applied using injection molding, liquid epoxy application, or other method of applying mold compound to the substrate, dies, and vias of the electronic package. In some examples, where the photo resist layer is applied, the photo resist layer can be removed before the mold is applied over the substrate, the first die, the second die, and the plurality of vias (e.g., the first via and the second via).

At 710, an upper portion of the mold can be removed to provide a planar upper surface on the mold. The first via and the second via can be exposed and located along the planar upper surface. In some examples, the first via can be trimmed to have a different length than the second via based on the difference between the height of a first die and a height second die with respect to the substrate. In an example, the planar upper surface can include a conductive routing. The conductive routing can be electrically coupled to at least one of the first or second vias. The third die can be communicatively coupled to the conductive routing.

In a further example, a third die can be attached to the first via and the second via. For instance, one or more interconnects as previously described herein can be used to attach the third die to the respective first and second vias. In an example, a plurality of interconnects having the same dimensions can be used to couple the third die to the first and second vias.

In other examples, the first die can be communicatively coupled to the second die with an interconnect bridge, such as the interconnect bridge 640. In some instances, the interconnect bridge can be located within the substrate and communicatively coupled to the first die and second die using a plurality of interconnects. In other examples, the third die can be an interconnect bridge. The interconnect bridge can be communicatively coupled to the first die and the second die using a plurality of planarized vias, such as the first via or the second via. In other words, the interconnect bridge can be attached to the first via and the second via along the planar upper surface of the mold.

FIG. 8 illustrates a system level diagram in accordance with some embodiments of the invention. For instance, FIG. 8 depicts an example of an electronic device 800 (e.g., system) including an electronic package, such as the electronic packages 100-600 as described herein. FIG. 8 is included to show an example of a higher level device application for the present invention. In one embodiment, system 800 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 800 is a system on a chip (SOC) system.

In one embodiment, processor 810 has one or more processing cores 812 and 812N, where 812N represents the Nth processor core inside processor 810 where N is a positive integer. For instance, the processing core 812 or processing core 812N can include the first die (e.g., first die 104 or 204), the second die (e.g., the second die 106 or 206), or the third die (e.g., third die 232), as previously described herein. In one embodiment, system 800 includes multiple processors including 810 and 805, where processor 805 has logic similar or identical to the logic of processor 810. In some embodiments, processing core 812 includes, but is not limited to, pre-fetch logic to fetch instructions, decode logic to decode the instructions, execution logic to execute instructions and the like. In some embodiments, processor 810 has a cache memory 816 to cache instructions and/or data for system 800. Cache memory 816 may be organized into a hierarchal structure including one or more levels of cache memory.

In some embodiments, processor 810 includes a memory controller 814, which is operable to perform functions that enable the processor 810 to access and communicate with memory 830 that includes a volatile memory 832 and/or a non-volatile memory 834. In some embodiments, processor 810 is coupled with memory 830 and chipset 820. In an example, the memory 830 can include the first electronic package 110 or the second electronic package 120. Processor 810 may also be coupled to a wireless antenna 878 to communicate with any device configured to transmit and/or receive wireless signals. In one embodiment, the wireless antenna interface 878 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 832 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 834 includes, but is not limited to, flash memory, phase change memory (PCM), read-only memory (ROM), electrically erasable programmable read-only memory (EEPROM), or any other type of non-volatile memory device.

Memory 830 stores information and instructions to be executed by processor 810. In one embodiment memory 830 may also store temporary variables or other intermediate information while processor 810 is executing instructions. In the illustrated embodiment, chipset 820 connects with processor 810 via Point-to-Point (PtP or P-P) interfaces 817 and 822. Chipset 820 enables processor 810 to connect to other elements in system 800. In some embodiments of the invention, interfaces 817 and 822 operate in accordance with a PtP communication protocol such as the Intel® QuickPath Interconnect (QPI) or the like. In other embodiments, a different interconnect may be used.

In some embodiments, chipset 820 is operable to communicate with processor 810, 805N, display device 840, and other devices 872, 876, 874, 860, 862, 864, 866, 877, etc. In an example, the chipset 820 can include the integrated circuit 100. Chipset 820 may also be coupled to a wireless antenna 878 to communicate with any device configured to transmit and/or receive wireless signals.

Chipset 820 connects to display device 840 via interface 826. Display 840 may be, for example, a liquid crystal display (LCD), a plasma display, cathode ray tube (CRT) display, or any other form of visual display device. In some embodiments of the invention, processor 810 and chipset 820 are merged into a single SOC. In addition, chipset 820 connects to one or more buses 850 and 855 that interconnect various elements 874, 860, 862, 864, and 866. Buses 850 and 855 may be interconnected together via a bus bridge 872. In one embodiment, chipset 820, via interface 824, couples with a non-volatile memory 860, a mass storage device(s) 862, a keyboard/mouse 864, a network interface 866, smart TV 876, consumer electronics 877, etc. In various examples, the integrated circuit 100 can be included in at least one or more of the display 840, smart TV 876, I/O devices 874, non-volatile memory 860, storage medium 862, network interface 866, processor 805, or consumer electronics device 877.

In one embodiment, mass storage device 862 includes, but is not limited to, a solid state drive, a hard disk drive, a universal serial bus flash memory drive, or any other form of computer data storage medium. In one embodiment, network interface 866 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra-Wide Band (UWB), Bluetooth, WiMax, or any form of wireless communication protocol.

While the modules shown in FIG. 8 are depicted as separate blocks within the system 800, the functions performed by some of these blocks may be integrated within a single semiconductor circuit or may be implemented using two or more separate integrated circuits. For example, although cache memory 816 is depicted as a separate block within processor 810, cache memory 816 (or selected aspects of 816) can be incorporated into processor core 812.

Various Notes & Examples

Each of these non-limiting examples may stand on its own, or may be combined in various permutations or combinations with one or more of the other examples. To better illustrate the method and apparatuses disclosed herein, a non-limiting list of embodiments is provided here:

Example 1 is an electronic package including: a substrate; a first die coupled to the substrate, the first die having a first thickness; a second die coupled to the substrate, the second die having a second thickness; a mold disposed on the substrate and covering the first die and the second die, the mold includes a planar upper surface; a first via having a first length extended between the first die and the planar upper surface; and a second via having a second length extended between the second die and the planar upper surface.

In Example 2, the subject matter of Example 1 optionally includes wherein the first thickness is different than the second thickness.

In Example 3, the subject matter of any one or more of Examples 1-2 optionally include wherein at least one of the first or second vias is a through silicon via.

In Example 4, the subject matter of any one or more of Examples 1-3 optionally include wherein the first via includes a mold portion extended along the first length and a die portion extended into the first die.

In Example 5, the subject matter of Example 4 optionally includes wherein the mold portion of the first via includes a first width and the die portion of the first via includes a second width different than the first width.

In Example 6, the subject matter of Example 5 optionally includes wherein the second via includes a second mold portion extended along the second length, a width of the second mold portion is the same as the first width of the first mold portion.

In Example 7, the subject matter of Example 6 optionally includes wherein a pitch of the first die portion is different than a pitch of the second die portion.

In Example 8, the subject matter of any one or more of Examples 1-7 optionally include wherein the first length is different than the second length.

In Example 9, the subject matter of any one or more of Examples 1-8 optionally include a third die attached to the upper surface and communicatively coupled to the first die by the first via and the second die by the second via.

In Example 10, the subject matter of Example 9 optionally includes wherein the third die is attached to the first via and the second via with respective interconnects, the interconnects having the same dimensions.

In Example 11, the subject matter of any one or more of Examples 9-10 optionally include wherein the planar upper surface includes conductive routing, the conductive routing electrically coupled to at least one of the first or second vias, and the third die communicatively coupled to the conductive routing.

In Example 12, the subject matter of any one or more of Examples 9-11 optionally include wherein the third die is an interconnect bridge.

Example 13 is a method of constructing a stacked die electronic package with a plurality of extended through-mold vias, the method including: forming a first via disposed from a first die; forming a second via disposed from a second die; attaching the first die and the second die to a substrate; applying a mold over the substrate, first die, the second die, the first via, and the second via; and removing an upper portion of the mold to provide a planar upper surface on the mold, wherein the first via and the second via are exposed and located on the planar upper surface.

In Example 14, the subject matter of Example 13 optionally includes wherein a thickness of the first die is different than a thickness of the second die.

In Example 15, the subject matter of any one or more of Examples 13-14 optionally include wherein forming the first via disposed from the first die and the second via disposed from the second die includes forming a mold portion of the first and second vias on the upper surface of the respective first and second dies and a die portion of the first and second vias within the respective first and second dies.

In Example 16, the subject matter of Example 15 optionally includes wherein the mold portion of at least one of the first or second vias includes a different width than the die portion of the respective first or second via.

In Example 17, the subject matter of any one or more of Examples 13-16 optionally include wherein forming the first via and the second via includes: applying a photo resist layer to the respective first and second dies; forming a first aperture in the photo resist layer of the first die; forming a second aperture in the photo resist layer of the second die; depositing a conductive material in the first aperture and the second aperture; and removing the photo resist layer.

In Example 18, the subject matter of any one or more of Examples 13-17 optionally include wherein removing an upper portion of the mold to provide a planar upper surface includes trimming the first via to have a different length than the second via based on the difference between the height of a first die and a height second die from the substrate.

In Example 19, the subject matter of any one or more of Examples 13-18 optionally include attaching a third die to the first via and the second via.

In Example 20, the subject matter of Example 19 optionally includes wherein the third die is attached to the first via and the second via with respective interconnect, the interconnect having the same dimensions.

In Example 21, the subject matter of any one or more of Examples 19-20 optionally include wherein the planar upper surface includes conductive routing, the conductive routing electrically coupled to at least one of the first or second vias, and the third die communicatively coupled to the conductive routing.

In Example 22, the subject matter of any one or more of Examples 19-21 optionally include wherein the third die is an interconnect bridge.

Example 23 is an electronic package including: a substrate; a first die coupled to the substrate, the first die having a first thickness; a second die coupled to the substrate, the second die having a second thickness different than the first thickness; a mold disposed on the substrate and covering the first die and the second die, the mold includes a planar upper surface; a first via having a die portion located within the first die and a mold portion having a first length extended between the first die and the planar upper surface; a second via having a die portion located within the second die and a mold portion having a second length extended between the second die and the planar upper surface, wherein the second length is different than the first length; and a third die attached to the upper surface and communicatively coupled to the first die by the first via and the second die by the second via.

In Example 24, the subject matter of Example 23 optionally includes wherein the mold portion of the first via includes a first width and the die portion of the first via includes a second width different than the first width.

In Example 25, the subject matter of Example 24 optionally includes wherein the second via includes a second mold portion extended along the second length, a width of the second mold portion is the same as the first width of the first mold portion.

In Example 26, the subject matter of Example 25 optionally includes wherein a pitch of the first die portion is different than a pitch of the second die portion.

In Example 27, the subject matter of any one or more of Examples 23-26 optionally include wherein the third die is attached to the first via and the second via with respective interconnects, the interconnects having the same dimensions.

In Example 28, the subject matter of any one or more of Examples 23-27 optionally include wherein the planar upper surface includes conductive routing, the conductive routing electrically coupled to at least one of the first or second vias, and the third die communicatively coupled to the conductive routing.

In Example 29, the subject matter of any one or more of Examples 23-28 optionally include wherein the third die is an interconnect bridge.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A method of constructing a stacked die electronic package with a plurality of extended through-mold vias, the method comprising:
    forming a first via disposed from a first die;
    forming a second via disposed from a second die;
    attaching the first die and the second die to a substrate, the first die including a first active surface and the second die including a second active surface, wherein both the first active surface and the second active surface are facing the substrate;
    applying a mold over the substrate, first die, the second die, the first via, and the second via;
    removing an upper portion of the mold to provide a planar upper surface on the mold, wherein the first via and the second via are exposed and coplanar with the planar upper surface;
    attaching a third die to the upper surface and communicatively coupling the third die to the first and second vias; and
    situating an interconnect bridge in the substrate and electrically connecting the interconnect bridge to the first and second dies through the first and second active surfaces.

2. The method of claim 1, wherein a thickness of the first die is different than a thickness of the second die.

3. The method of claim 1, wherein forming the first via disposed from the first die and the second via disposed from the second die includes forming a mold portion of the first and second vias on the upper surface of the respective first and second dies and a die portion of the first and second vias within the respective first and second dies.

4. The method of claim 3, wherein the mold portion of at least one of the first or second vias includes a different width than the die portion of the respective first or second via.

5. The method of claim 1, wherein forming the first via and the second via includes:
    applying a photo resist layer to the respective first and second dies;
    forming a first aperture in the photo resist layer of the first die;
    forming a second aperture in the photo resist layer of the second die;

depositing a conductive material in the first aperture and the second aperture; and removing the photo resist layer.

6. The method of claim 1, wherein removing an upper portion of the mold to provide a planar upper surface includes trimming the first via to have a different length than the second via based on the difference between the height of a first die and a height second die from the substrate.

7. The method of claim 1, wherein the third die is attached to the first via and the second via with respective interconnect, the interconnect having the same dimensions.

8. The method of claim 1, wherein the planar upper surface includes conductive routing, the conductive routing electrically coupled to at least one of the first or second vias, and the third die communicatively coupled to the conductive routing.

9. A method comprising:

forming a first via disposed from a first die;

forming a second via disposed from a second die;

providing a substrate;

electrically connecting the first die to conductive routing in the substrate through a first active surface of the first die facing the substrate, the first die having a first thickness;

electrically connecting the second die to conductive routing in the substrate through a second active surface of the second die facing the substrate, the second die having a second thickness;

disposing a mold on the substrate and in contact with and covering a third surface of the first die facing away from the first active surface and a fourth surface of the second die facing away from the second active surface, the mold includes a planar upper surface;

removing an upper portion of the mold to provide a planar upper surface on the mold, wherein the first via and the second via are exposed and coplanar with the planar upper surface;

electrically connecting a third die to the upper surface and communicatively coupling the third die to the first and second vias; and situating an interconnect bridge in the substrate and electrically connecting the interconnect bridge to the first and second dies through the first and second active surfaces.

10. The method of claim 9, wherein the first thickness is different than the second thickness.

11. The method of claim 9, wherein forming the first via disposed from the first die and the second via disposed from the second die includes forming a mold portion of the first and second vias on the upper surface of the respective first and second dies and a die portion of the first and second vias within the respective first and second dies.

12. The method of claim 11, wherein the mold portion of at least one of the first or second vias includes a different width than the die portion of the respective first or second via.

13. The method of claim 9, wherein forming the first via and the second via includes:

applying a photo resist layer to the respective first and second dies;

forming a first aperture in the photo resist layer of the first die;

forming a second aperture in the photo resist layer of the second die;

depositing a conductive material in the first aperture and the second aperture; and removing the photo resist layer.

14. The method of claim 9, wherein removing an upper portion of the mold to provide a planar upper surface includes trimming the first via to have a different length than the second via based on the difference between the height of a first die and a height second die from the substrate.

15. The method of claim 9, wherein the third die is attached to the first via and the second via with respective interconnects, the interconnects having the same dimensions.

16. The method of claim 9, wherein the planar upper surface includes conductive routing, the conductive routing electrically coupled to at least one of the first or second vias, and the third die communicatively coupled to the conductive routing.

* * * * *